(12) United States Patent
Burns

(10) Patent No.: US 6,445,325 B1
(45) Date of Patent: Sep. 3, 2002

(54) PIECEWISE LINEAR DIGITAL TO ANALOG CONVERSION

(75) Inventor: Mark A. Burns, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/036,929

(22) Filed: Dec. 21, 2001

Related U.S. Application Data

(60) Provisional application No. 60/316,046, filed on Aug. 30, 2001.

(51) Int. Cl.[7] .................................. H03M 2/66
(52) U.S. Cl. .................. 341/144; 341/153; 341/154
(58) Field of Search .................. 341/144, 153, 341/154

(56) References Cited

U.S. PATENT DOCUMENTS

| | | | | |
|---|---|---|---|---|
| 4,641,131 A | * | 2/1987 | Demmer | 340/347 |
| 5,111,205 A | * | 5/1992 | Morlon | 341/118 |
| 5,160,930 A | * | 11/1992 | Hosotani et al. | 341/154 |
| 5,739,782 A | * | 4/1998 | Uda | 341/154 |
| 5,764,174 A | * | 6/1998 | Dempsey et al. | 341/136 |
| 5,828,330 A | * | 10/1998 | Benzel | 341/136 |
| 5,841,384 A | * | 11/1998 | Herman et al. | 341/138 |
| 6,133,863 A | * | 10/2000 | Peng | 341/120 |
| 6,157,335 A | * | 12/2000 | Suzuki et al. | 341/144 |
| 6,204,785 B1 | * | 3/2001 | Fattaruso et al. | 341/120 |

* cited by examiner

Primary Examiner—Michael Tokar
Assistant Examiner—Khai Nguyen
(74) Attorney, Agent, or Firm—Bret J. Petersen; Frederick J. Telecky, Jr.; W. James Brady

(57) ABSTRACT

A digital to analog converter includes a network of impedance components having a plurality of nodes having associated voltages. A tap is coupled to one or more associated one of the plurality of nodes to source or sink electrical current relative to the associated node(s). A switching system is operative to couple a selected one of the nodes to an output according to a digital input word and thereby provide an analog voltage corresponding to the digital input.

30 Claims, 13 Drawing Sheets

PIECEWISE LINEAR DIGITAL TO ANALOG CONVERSION

RELATED APPLICATION

This application claims the benefit of U.S. Provisional Patent Application No. 60/316,046, which was filed Aug. 30, 2001, and which is incorporated herein by reference.

TECHNICAL FIELD

The present invention relates generally to electrical circuits and, more particularly, to piecewise linear digital to analog conversion.

BACKGROUND OF THE INVENTION

A digital-to-analog converter (DAC) converts a digital input, which can include one or more bits of data, into an analog output signal functionally related to the digital input data. A DAC is typically implemented in an integrated circuit or chip, although it can be implemented on a circuit board by an appropriate arrangement of components. DACs further can be utilized in a variety of applications, such as instrumentation applications, level detection applications, drivers for LCD screens, servo tracking, and communications applications.

A common type of DAC is a linear DAC that generates an analog output signal that varies linearly with respect to the value of the digital input signal. By way of example, a weighted-resistor DAC includes a network of resistors connected to a summing node. The bits of the input digital signal are connected to corresponding switches, such as transistors. Each switch connects one of the resistors into the network if the corresponding bit is HIGH and disconnects the resistor from the network if the corresponding bit is LOW. The resulting resistor has a value that is weighted according to the position of the bit. The summing node sums the collective currents contributed by the resistors that are switched into the network, thereby producing a current functionally related to the digital input. The output current can be provided to a suitable amplifier to convert the current into a voltage output.

An R-2R ladder DAC is a variation of the weighted-resistor DAC. The R-2R ladder DAC has a resistor network configured to minimize the range of resistor values. The R-2R DAC can include first and second stages of resistor strings coupled together via a first switching network. A reference voltage potential is coupled across the first stage resistor string. A switching network (e.g., a multiplexer) operates to couple a voltage produced at a selected node in the first resistor string across the second stage resistor string. A second switching network couples an output at a selected one of the resistors in the second resistor string to an output of the DAC. Buffer amplifiers also can be provided to convert the output of the second switching network to a corresponding voltage signal.

Similar types of DACs are known that use a capacitor network rather than a resistor network. A related type of DAC, known as a binary-weighted current sink DAC, includes weighted current sources rather than weighted resistors.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the present invention provides a digital to analog converter (DAC) that includes a network of impedance components having a plurality of nodes having associated voltages. A tap is coupled to an associated one of the plurality of nodes to source or sink electrical current relative to the associated node. A switching system is operative to couple a selected one of the nodes to an output according to a digital input word, such as to provide an analog voltage corresponding to the digital input.

In a particular aspect of the present invention, a plurality of taps (e.g., resistive taps) can be connected at different breakpoint nodes so as to provide desired breakpoint voltages at such nodes. For example, if the network of impedance components are arranged to provide segments of evenly spaced voltages between breakpoint nodes, desired transfer characteristics can be approximated by appropriate selection of the breakpoint voltages.

Another aspect of the present invention provides a method for making a DAC. The method includes determining desired transfer characteristics of the DAC and determining a number of breakpoints for approximating the desired transfer characteristics, such as with piecewise linear segments between such breakpoints. Breakpoint voltages can then be determined for each of the breakpoints so as to implement the desired transfer characteristics, which can be monotonic or non-monotonic.

Still another aspect of the present invention provides a method for testing operating characteristics of a DAC that includes a switch operative to connect an intermediate node of the DAC with high voltage potential. The method includes activating the switch and supplying the high voltage at the test node. Digital input words are supplied to the DAC up to a word having a value associated with the test node. An output voltage of the DAC is measured in response to the application of digital words. The measurements provide an indication of the performance of the DAC.

The following description and the annexed drawings set forth in certain illustrative aspects of the invention. These aspects are indicative, however, of a few ways in which the principles of the invention may be employed. Other advantages and novel features of the invention will become apparent from the following detailed description of the invention when considered in conjunction with the drawings.

DETAILED DESCRIPTION OF THE INVENTION

Figure 1:
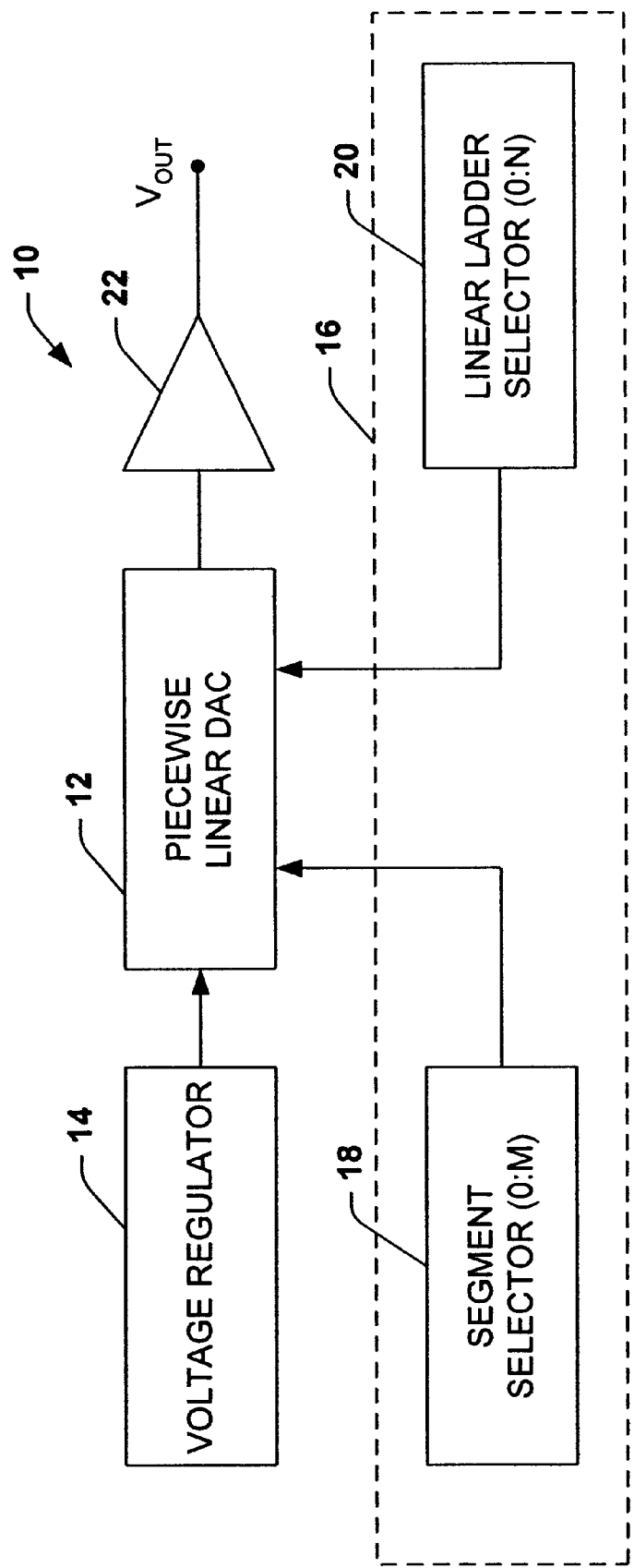
FIG. 1 is a block diagram of a piecewise linear DAC system in accordance with an aspect of the present invention.

FIG. 1 illustrates a block diagram of a system 10 operative to implement piecewise linear digital to analog conversion in accordance with an aspect of the present invention. The system 10 includes a piecewise linear DAC 12 that is configured to convert a digital word input having a predetermined number of bits into a corresponding analog signal. The DAC is configured to select one of a plurality of nodes having different voltage potentials based on the digital word input. The DAC 12 also includes one or more taps that can sink or source current relative to one or more the nodes to provide desired non-linearity (e.g., different slope of the output signal) for different sets (or segments) of associated nodes in accordance with an aspect of the present invention.

The DAC 12 is coupled to a voltage regulator 14 to receive one or more regulated reference voltages. For example, the regulator 14 can provide a high reference voltage and a low reference voltage to the DAC so as to establish a range of voltage potentials between which the DAC output voltage can swing. It is to be understood and appreciated to those skilled in the art that the reference voltages can be fixed or variable.

The DAC 12 also is coupled to a selection system 16, which includes switch devices, such as transistors (e.g., MOSFETs), that are arranged to implement desired conversion. The selection system 16 provides control signals to selectively activate and deactivate the various switch devices of the DAC 12, such that a selected node of the DAC (having an associated voltage level) is connected to the DAC output according to the digital input word being converted.

By way of example, the DAC 12 includes two DAC stages. The first stage includes switch devices operative to select a segment of the second DAC stage. The DAC second stage can include a plurality of segments connected in series between the reference voltages. Each segment further can include a plurality of nodes having selectable voltages that vary linearly between break-point voltages of the adjacent segments (e.g., substantially evenly spaced voltage levels). Each segment thus provides piecewise linear voltage levels. In accordance with an aspect of the present invention, the DAC 12 further includes taps operative to source or sink current at one or more nodes, such as located between one or more adjacent segments of the second stage of the DAC.

For example, if the DAC 12 includes taps configured to only source current into nodes located between adjacent segments or to only sink current out of nodes between adjacent segments, then desired monotonicity of the DAC is guaranteed to be monotonic, with the slope of corresponding segments being monotonically increasing or monotonically decreasing, respectively. If some taps are configured as sinks and others as sources then the slope of the segments can be made to turn either up or down accordingly. Selected breakpoints between adjacent segments can be set to any arbitrary voltage between the positive and negative voltage by selecting a desired amount of current to source into or sink out of the breakpoints. In this way, any arbitrary transfer characteristic can be approximated with piecewise linear segments of the DAC 12 (exponential, logarithmic, S-shaped, etc.) in accordance with an aspect of the present invention.

By way of further illustration, the DAC 12 is operative to connect a selected node of the DAC to the DAC output according to input control provided by the selection system 16. The selection system 16, for example, includes a segment selector 18 operative to provide a segment selection signal. The segment selector 18 can provide a M-bit signal (where M is a positive integer greater than zero) to the DAC 12, such as corresponds to the Most Significant Bits (MSBs) of the digital input word. The number of bits determines the maximum number of possible segments in the DAC. The selection system 16 also includes a linear ladder selector 20 that is operative to provide a N-bit input signal to the DAC 12 (where N is a positive integer greater than zero). The number of bits in the signal from the ladder selector 20 determines the maximum number of possible analog voltage levels in each piecewise linear segment. Thus, the value of the ladder selection signal determines which node in the selected segment of the DAC 12 will be connected to the output. Those skilled in the art will understand and appreciate various other approaches to node selection can be implemented in conjunction with a DAC in accordance with an aspect of the present invention.

The output of the DAC 12 can be provided to an amplifier 22. The amplifier 22, for example, is a voltage follower buffer amplifier operative to decrease the output impedance of the DAC. Those skilled in the art will understand appreciate various implementations of amplifiers that could be utilized to appropriately amplify the DAC output signal to provide the output voltage $V_{Out}$.

Figure 2:
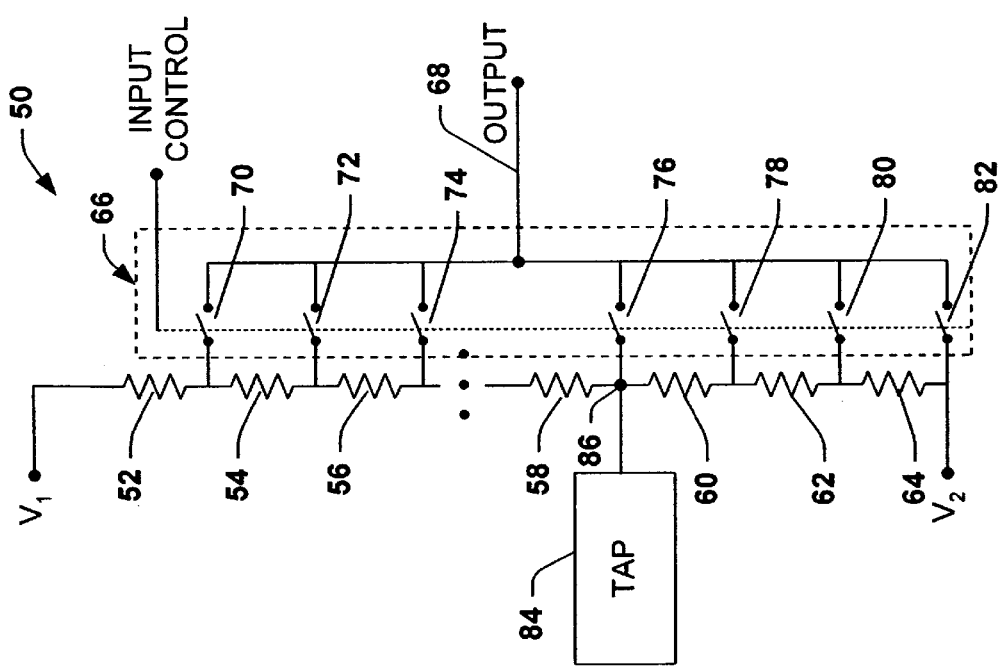
FIG. 2 is a schematic illustration of a piecewise linear DAC in accordance with an aspect of the present invention.

FIG. 2 illustrates an example of a piecewise linear DAC 50 that exhibits non-linear behavior for part of the DAC in accordance with an aspect of the present invention. In this example, the DAC is implemented as a plurality of resistors 52, 54, 56, 58, 60, 62, and 64 connected in series between reference voltage potentials $V_1$ and $V_2$. The resistors 52–64 can be matched resistors (e.g., unit resistors) such that the voltage drop across each of the resistors remains constant (e.g., evenly spaced voltages). The nodes between each of the resistors 52–64 are connected through a switching network 66 to provide the DAC output 68. That is, the switching network 66, which can be implemented as a multiplexer, is operative to selectively connect a given output node to the output 68 based on the value of a digital input word. For example, the switching network 66 includes a plurality of switches 70, 72, 74, 76, 78, 80, and 82 for connecting an associated node to the output 68. The DAC 50 typically has a number of nodes equal to the number of possible values of the digital input word. For example, the output of the desired node from the resistor ladder can be chosen using one of the switches 70–82, or, alternatively, it could be selected using a more traditional chord/segment arrangement.

In accordance with an aspect of the present invention, the DAC 50 also includes a tap 84 at one or more nodes 86 that is operative to source or sink current into or out of the node. By configuring the tap 84 to source or sink a desired amount of current relative to the node 86, the portion of the DAC 50 between the node 86 and reference voltage $V_1$ and the portion of the DAC between the node 84 and reference voltage $V_2$ will exhibit different linear incremental voltage changes between nodes. While one tap 84 is depicted in the example of FIG. 2, it is to be understood and appreciated that any number of taps could be connected at corresponding nodes in the DAC 50 in accordance with an aspect of the present invention. In this way, virtually any arbitrary transfer characteristic (e.g., exponential, logarithmic, S-shaped, etc.) can be approximated in accordance with an aspect of the present invention.

Figure 3:
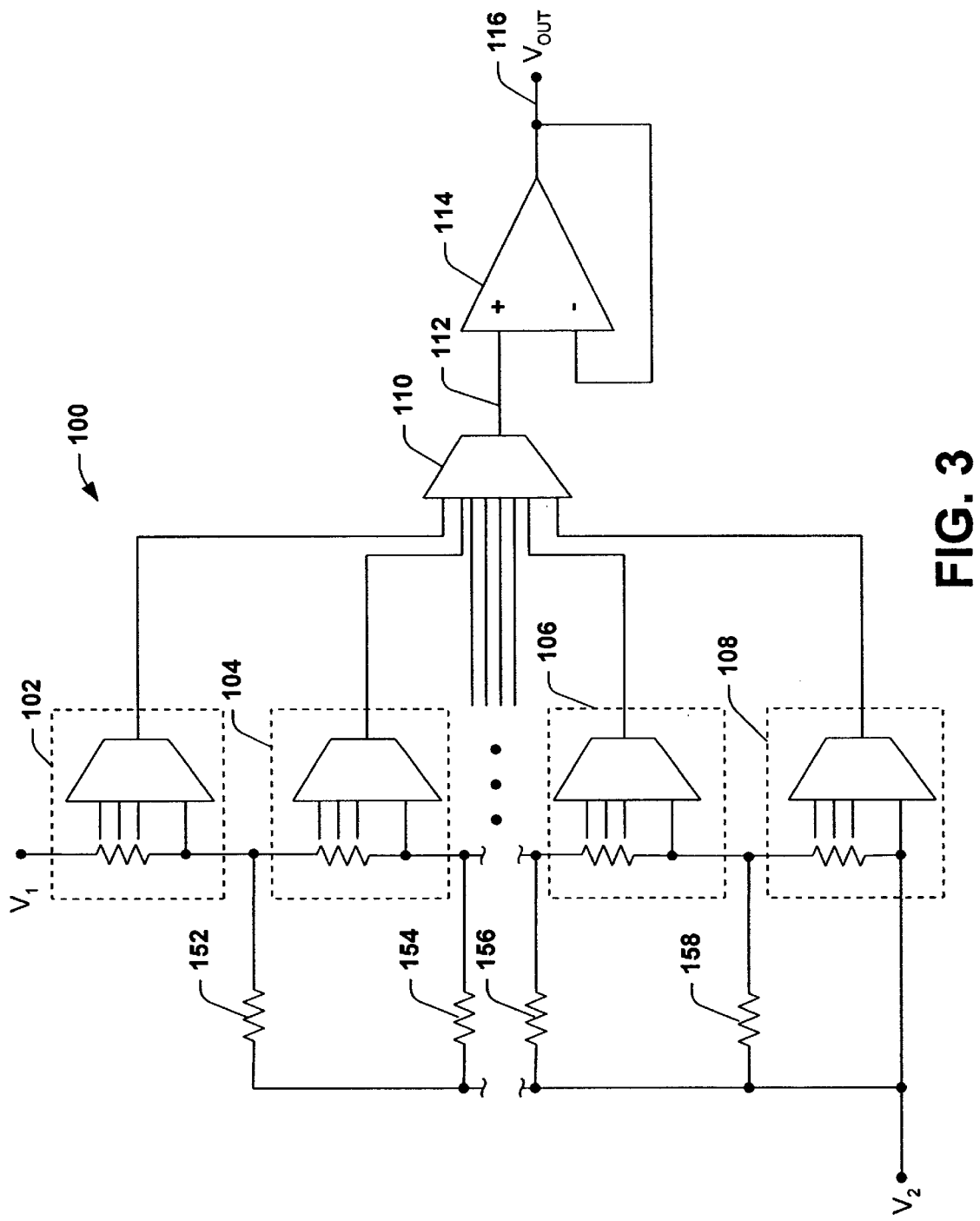
FIG. 3 is an example of a piecewise linear DAC implemented in accordance with an aspect of the present invention.

FIG. 3 illustrates an example of a DAC 100 configured to provide a piecewise linear exponential output in accordance with an aspect of the present invention. The DAC 100 includes a plurality of linear ladder systems 102, 104, 106 and 108 connected in series between reference voltages $V_1$ and $V_2$. For example, $V_1$ can be greater than $V_2$ or vice versa to provide a desired voltage potential between the reference voltages $V_1$ and $V_2$. Each of the linear ladders 102–108 is operative to provide an output to a segment selection MUX (or other arrangement of switches) 110. The MUX 110 is operative to selectively connect the output of a given one of the ladder systems 102–108 to the DAC output 112. The MUX 110 provides the DAC output to an optional amplifier (e.g., a voltage follower op-amp) 114, which in turn, provides a buffered indication of the DAC output $V_{out}$ at an associated output 116.

Figure 4:
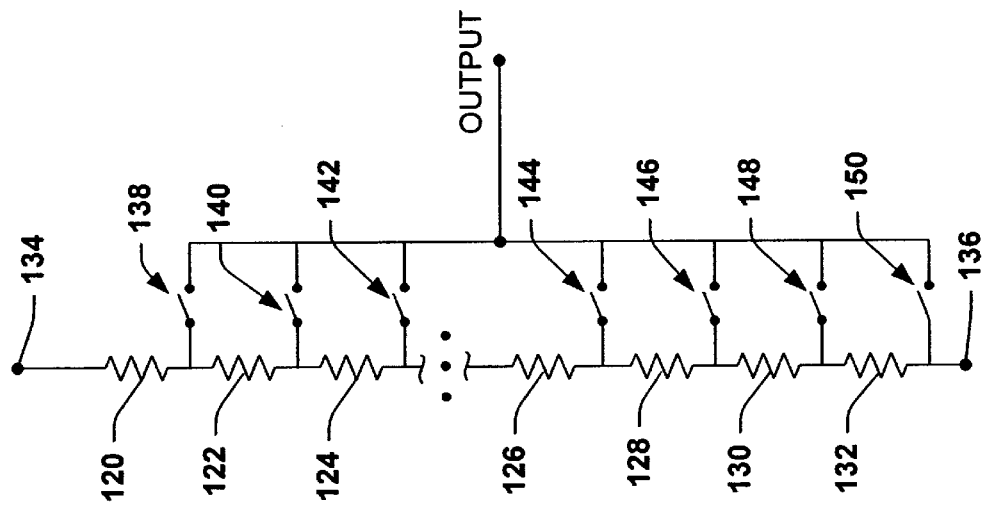
FIG. 4 is a more detailed view of part of the DAC of FIG. 3.

FIG. 4 illustrates an example of a type of ladder system that could be utilized for the ladder systems 102–108 in the system 100 of FIG. 3. Those skilled in the art will understand and appreciate other circuit arrangements that could be utilized in accordance with an aspect of the present invention. The ladder system includes a string of resistors 120, 122, 124, 126, 128, 130 and 132, which can be matched resistors (e.g., unit resistors). The resistors 120–132 are connected in series between end nodes 134 and 136, which can either connect the ladder system to another ladder system or to desired reference voltage, depending generally on the location of the ladder system in a DAC. Nodes between adjacent pairs of the resistors 120–132 and one end node (134 or 136) are coupled by associated switches 138, 140, 142, 144, 146, 148 and 150 to an output of the ladder system. The activation and deactivation of the respective switches 138–150 are controlled, for example, (mutually exclusively) based on part of a digital input word, such as some of the least significant bits thereof. Thus, the switches provide a multiplexing function by connecting a selected node of the resistor string to the output.

Referring back to FIG. 3, the DAC 100 also includes tap resistors 152, 154, 156 and 158 connected between $V_2$ and a breakpoint node connecting each pair of adjacent ladder systems 102–108. Thus, depending on the relative potential between $V_1$ and $V_2$, the tap resistors 152–158 will operate to either source or sink current relative to their associated nodes. This results in the transfer characteristics of each ladder system 102–108 exhibiting different linear slopes characteristics according to the values of resistors and the relative potential at its end nodes.

By way of example, for an eight-bit DAC 100, there may be eight linear ladder systems, each formed of a linear ladder of thirty-two resistors and associated switch devices, such as shown in FIG. 4. Assume, for purposes of illustration, that seven tap resistors 152–158 are configured to have respectively decreasing resistances (e.g., 376R, 179R, 69R, 55R, 47R, 29R and 24R, where R denotes a unit resistor, e.g., 1000 Ohms). Thus, if $V_1>V_2$, the DAC 100 output will have a monotonically increasing exponential transfer characteristic, such that the closer a given segment is to $V_1$, the greater its slope. Similarly, if $V_1<V_2$, the DAC 100 output transfer characteristic will be a monotonically decreasing exponential, such that the closer a given segment is to $V_1$, the lower its slope. Those skilled in the art will understand and appreciate that the values of the tap resistors 152–158 can be fixed or variable.

Figure 5:
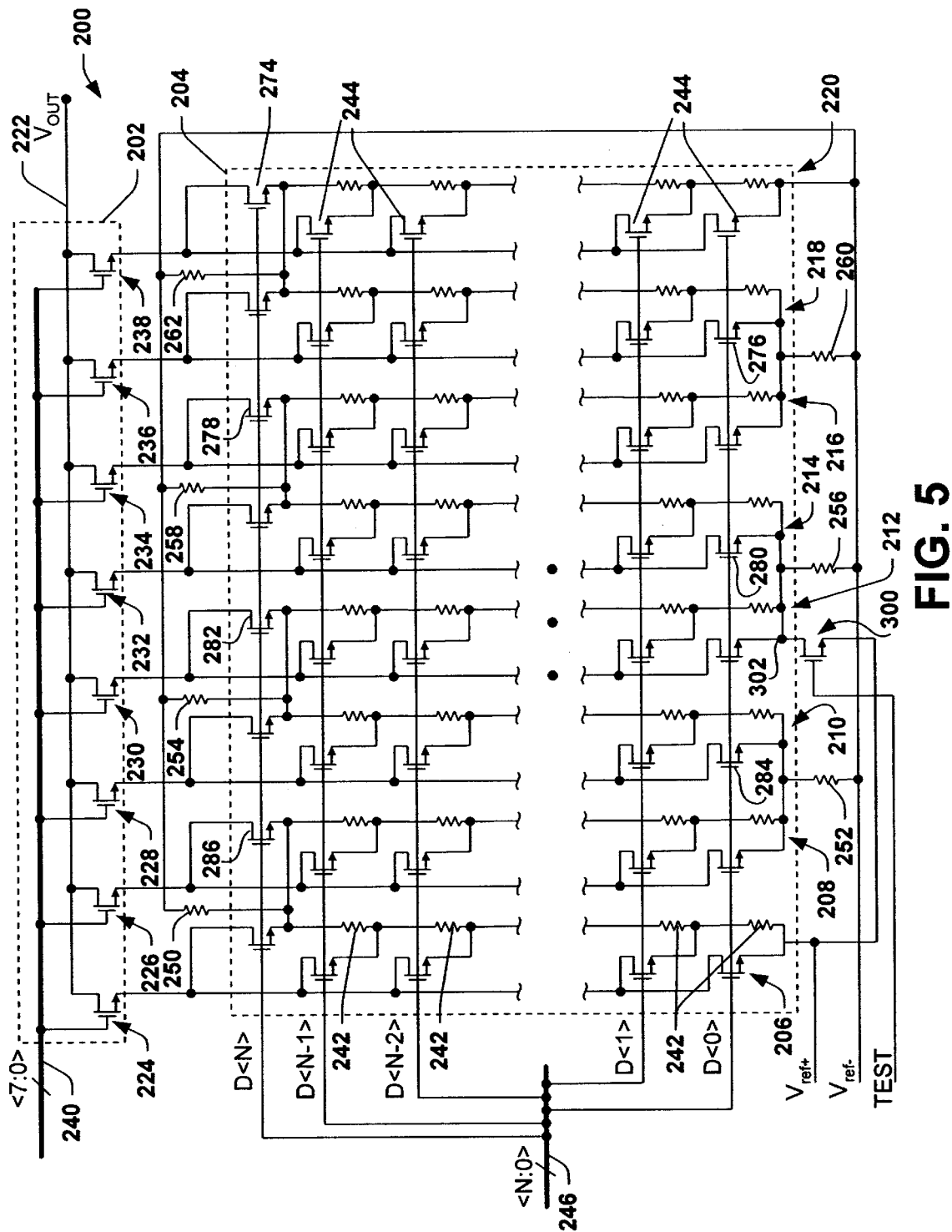
FIG. 5 is an example of a circuit illustrating a piecewise linear DAC implemented in accordance with an aspect of the present invention.

FIG. 5 illustrates an example of a circuit schematic of a DAC 200 that can be employed to implement digital to analog conversion in accordance with an aspect of the present invention. The DAC 200 includes two stages 202 and 204. The stage 202 corresponds to a segment selector stage for selecting one of a plurality of segments 206, 208, 210, 212, 214, 216, 218 and 220, the output of which is to be coupled through the stage 202 to an output 222 of the DAC 200.

The stage 202, for example, is a multiplexer that includes eight transistors (illustrated as MOSFETs) 224, 226, 228, 230, 232, 234, 236 and 238 connected between the DAC output 222 and an output node of an associated segment 206, 208, 210, 212, 214, 216, 218 and 220. The gate of each transistor 224–238 is coupled to an input bus 240 that provides a digital input control signals for selectively activating and deactivating each of the transistors. For example, because there are eight segments 224–238, a three-bit word would suffice as the input control signal.

The stage 204 corresponds to a node selector stage, which includes the segments 206, 208, 210, 212, 214, 216, 218 and 220. Each of the segments 206, 208, 210, 212, 214, 216, 218, 220 includes a plurality of resistors 242 connected in series between end nodes of each respective segment. Each of the segments 206–220 further is illustrated as being connected together in series between reference voltages $V_{ref+}$ and $V_{ref-}$. In this way, nodes between each pair of adjacent resistors 242 can provide a different incremental voltage ranging between $V_{ref+}$ and $V_{ref-}$ depending on its position in the resistor string and resistance value. The resistors 242, for example, are matched resistors, such as unit resistors of 1000 Ohms, although other resistance values (fixed or variable) could be used.

Each segment 206–220 in the stage 204 also includes switch devices 244, such as transistors (e.g., NMOS), are coupled to a node between each pair of resistors and an associated output node of the respective segment. The output node of each segment 206–220 further is connected to a drain of an associated switch device of the segment selector stage 202. An input bus 246 provides input control signals for controlling activation and deactivation of the switch devices 244 so as to select which of a plurality of nodes of a selected segment is to be coupled to the DAC output 222. The main resistor ladder connected between $V_{ref+}$ and $V_{ref-}$ thus produces thirty-two evenly spaced voltages between each of the eight breakpoint voltage pairs located between segments. For example, each segment can have thirty-three transistors controlled via thirty-three common input control signals being applied to each segment.

The DAC 200 also includes taps operative to sink or source current relative to a plurality of nodes of the resistor string of the stage 204. In the example illustrated in FIG. 5, the taps are depicted as a plurality of tap resistors 250, 252, 254, 256, 258, 260 and 262 connected between $V_{ref-}$ and breakpoint nodes between adjacent pairs of the segments 206–220. By this arrangement, the taps sink current out of each associated segment, thereby causing the DAC 200 to provide an increasing exponential output signal as a function of a digital input word. The resistors 250–262 have resistances selected to achieve a desired non-linearity between segments 206–220. For example, the resistors 250, 252, 254, 256, 258, 260 and 262 could have respectively decreasing resistances, such as 376R, 179R, 69R, 55R, 47R, 29R and 24R (where R denotes a unit resistor, e.g., 1000 Ohms).

Because all tap resistors 250–262 are connected to negative reference voltage $V_{ref-}$, the DAC 200 is guaranteed to be substantially increasing monotonic (assuming the absence of relatively large leakage currents in the resistive ladder). Similarly, if the tap resistors 250–252 were connected to positive reference $V_{ref+}$, the DAC 200 would be decreasing monotonic. It is to be understood and appreciated that each breakpoint node (between segments) can be set to any arbitrary voltage between the positive and negative voltage, such as through an appropriate choice of tap resistors or, in the alternative, by connecting a voltage or current source to such nodes. Thus, any arbitrary transfer characteristic can be approximated with piecewise linear segments (e.g., exponential, logarithmic, S-shaped, etc.) in accordance with an aspect of the present invention.

The tap resistors can be chosen using a very simple algorithm according to the desired non-linear characteristics to be approximated by the DAC 200. For example, a first breakpoint voltage $V_1$ defines the current $I_1$ through the first segment 220 of resistors 242 by the equation $I_1=32R/(V_1-V_{ref-})$. If the second breakpoint voltage is to be set at an appropriate level $V_2$ then the current $I_2$ through the resistors 242 of the second segment 218 must be equal to $I_2=32R/(V2-V1)$. The difference in currents $I_1$ and $I_2$ must be sunk or sourced by the tap resistor 262 at the first breakpoint node. Thus, the resistance value for the tap resistor 262 can be calculated as $R_{tap1}=(V_1-V_{ref-})/(I_2-I_1)$, if it is to sink current to $V_{ref-}$. Alternatively, the resistance value of the resistor 262 can be set to $R_{tap1}=(V_{ref+}-V_1)/(I_1-I_2)$, if it is to source current from $V_{ref+}$. To facilitate implementing the DAC in an integrated circuit, the tap resistor values may be rounded to the nearest unit resistor value N*R to achieve adequate accuracy in most cases. For enhanced accuracy the resistance values may be set by unit resistors in series and/or parallel combinations to achieve a resolution of fractions of a unit resistance (e.g., three unit resistors in parallel=⅓ R which can be connected in series with N unit resistors to produce N+⅓ R, etc.). The resistances for each of the other tap resistors 250–260 can be computed in a similar manner.

Figure 6:
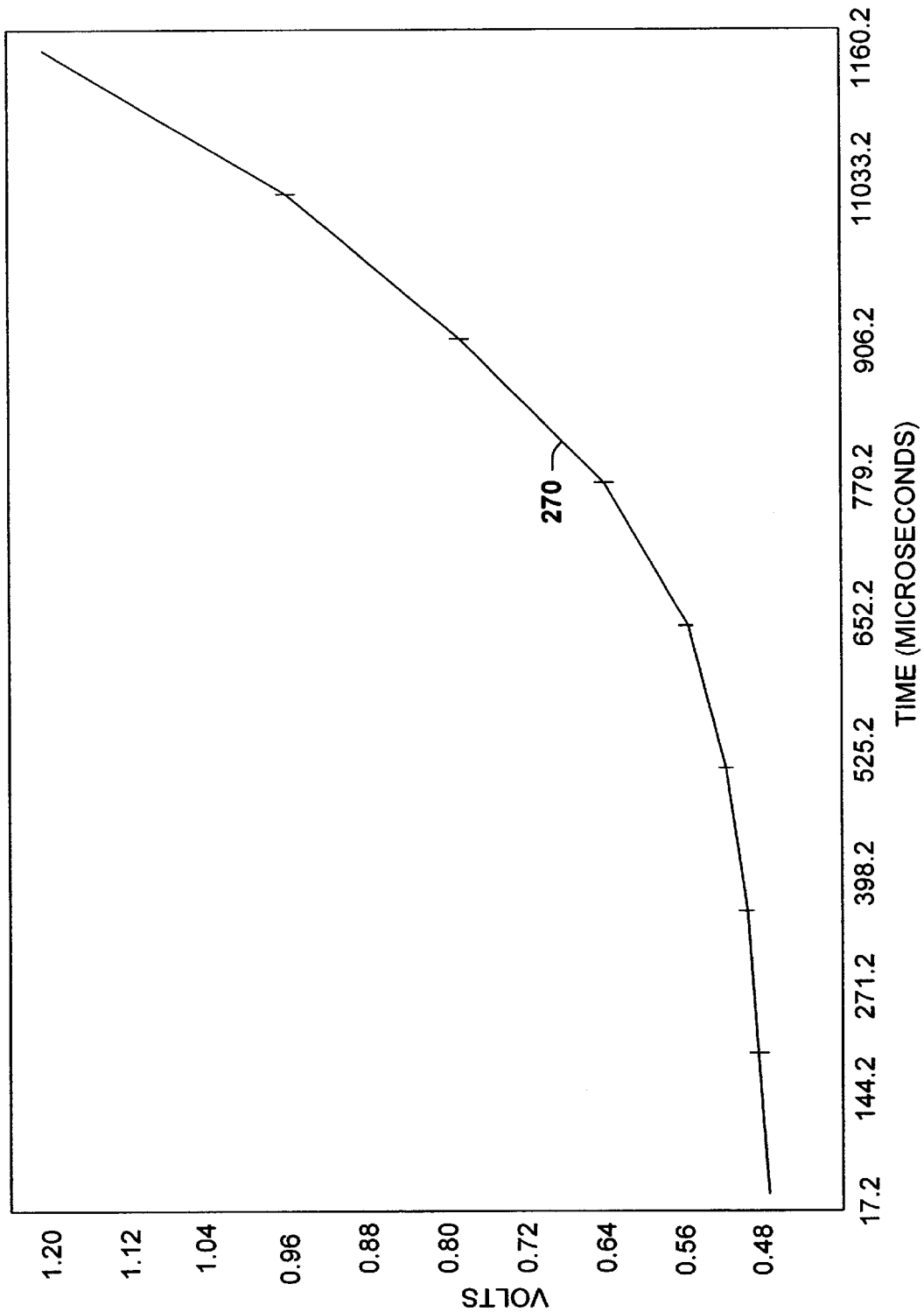
FIG. 6 is a graph illustrating an output provided by a piecewise linear DAC operating in accordance with an aspect of the present invention.

FIG. 6 illustrates a graph 270 in which voltage of the DAC output 222 (FIG. 5) is plotted (in volts) with respect to time (in microseconds) as a function of an increasing digital input signal. For example, as the digital input word is stepped from 0 to 255, different linear segments are switched in every 32 bits, providing the piecewise linear exponential output, as shown in FIG. 6. That is, the breakpoints between each of the segments provide a bend in the output signal in which the slope of each subsequent segment has increased slope relative to the previous segment, thereby providing a piecewise linear monotonically increasing exponential output. It is to be understood and appreciated that the tap resistors 250–262 could have different resistances so as to achieve different transfer characteristics from that shown in FIG. 6.

It is to be further understood and appreciated that if some tap resistors 250–262 in the DAC 200 of FIG. 5 were tied to the upper reference $V_{ref+}$ and some to the lower reference $V_{ref-}$, then the slope of the segments (e.g., FIG. 6) could be made to turn either up or down in a corresponding S-shape. Each breakpoint can, in accordance with an aspect of the present invention, be set to any arbitrary voltage (e.g., between $V_{ref+}$ and $V_{ref-}$), such as through the appropriate choice of tap resistors, current sources, voltage sources, and the like. Thus, any arbitrary transfer characteristic can be approximated with piecewise linear segments (exponential, logarithmic, S-shaped, etc.) by appropriate modifications to the DAC 200.

The arrangement in FIG. 5 also mitigates glitch energy associated with stepping through the nodes of the resistor string. Glitch energy exists due stray capacitances of associated MOSFET devices during switching, which can be more significant when moving between segments. Thus, to mitigate such capacitances, a control arrangement can be implemented in the DAC 200 so as to ensure that the output node of a subsequent segment is substantially equal to the output node of a preceding segment.

By way of example, in operation, n input control signals (designated D<0> through D<N>), which are supplied via the input bus 246, become active in a sequence corresponding to input codes being supplied to the DAC 200. In a particular sequence when the DAC 200 is controlled to proceed from the lowest code (e.g., code 0) to a higher code (e.g., code N+1), a particular sequencing arrangement is implemented in accordance with an aspect of the present invention. First, with the segment selection stage 202 selecting the segment 220, the input control D<0> becomes active to select the lowest voltage (e.g., generally equal to $V_{ref-}$). Then, D<0> would become inactive and D<1> would become active to select the second voltage associated with the next node of the segment 220. The sequence would proceed through D<2>, D<3>, etc. until the input control provides the code operative to select the node associated with D<N−1>. Then with the segment selection stage 202 deselecting the segment 220 and selecting segment 218, the control input 246 activates D<N> to select code N. Then, the input control 246 provides an appropriate code to deactivate D<N> and to activate the node switches via control D<N−1> to select code N+1 (e.g., the next code in the sequence).

It is to be understood and appreciated that, as the selection input at 246 changes from D<N−1> to D<N>, the voltage on the common output node of segment 218 (e.g., the second input of the segment selection stage 202) only has to change by 1 step. Therefore, the DAC output 222 can settle quickly to its final value without a large glitch. In a more traditional architecture, in which the selection sequence progresses from D<0> through D<N−1> and then back to D<0> at the beginning of the second segment, the change in voltage would be N−1 steps, which usually results in a large settling time increased glitch energy compared to the circuit illustrated in FIG. 5.

It is further to be appreciated that the particular architecture of FIG. 5 also has seven redundant switches (e.g., MOSFETs) 274, 276, 278, 280, 282, 284 and 286. The redundant switches 274–286 are connected to each of the tap resistors, with some switches 276, 280 and 284 associated with input D<0> and other of the switches 274, 278, 282, and 286 being associated with input D<N>. The redundant switches 274–286 are operative to further reduce glitches by providing a charge injection cancellation. For example, when transitioning from code N to code N−1, the gate capacitance on the redundant switches 274, 278, 282, and 286 connected to D<N> substantially cancels the charge injection from the gate of the switch connected to D<N-1>. This is because the gate voltage in one case is a rising digital edge, while the gate voltage in the other case is a falling digital edge. Similar switching is implemented via the redundant switches 276, 280 and 284 when transitioning between adjacent segments using D<0> and D<1>. Thus, glitch energy can be advantageously reduced by employing the redundant MOSFETs 274–286 for switching between adjacent pairs of the segments 206–220.

Figure 7:
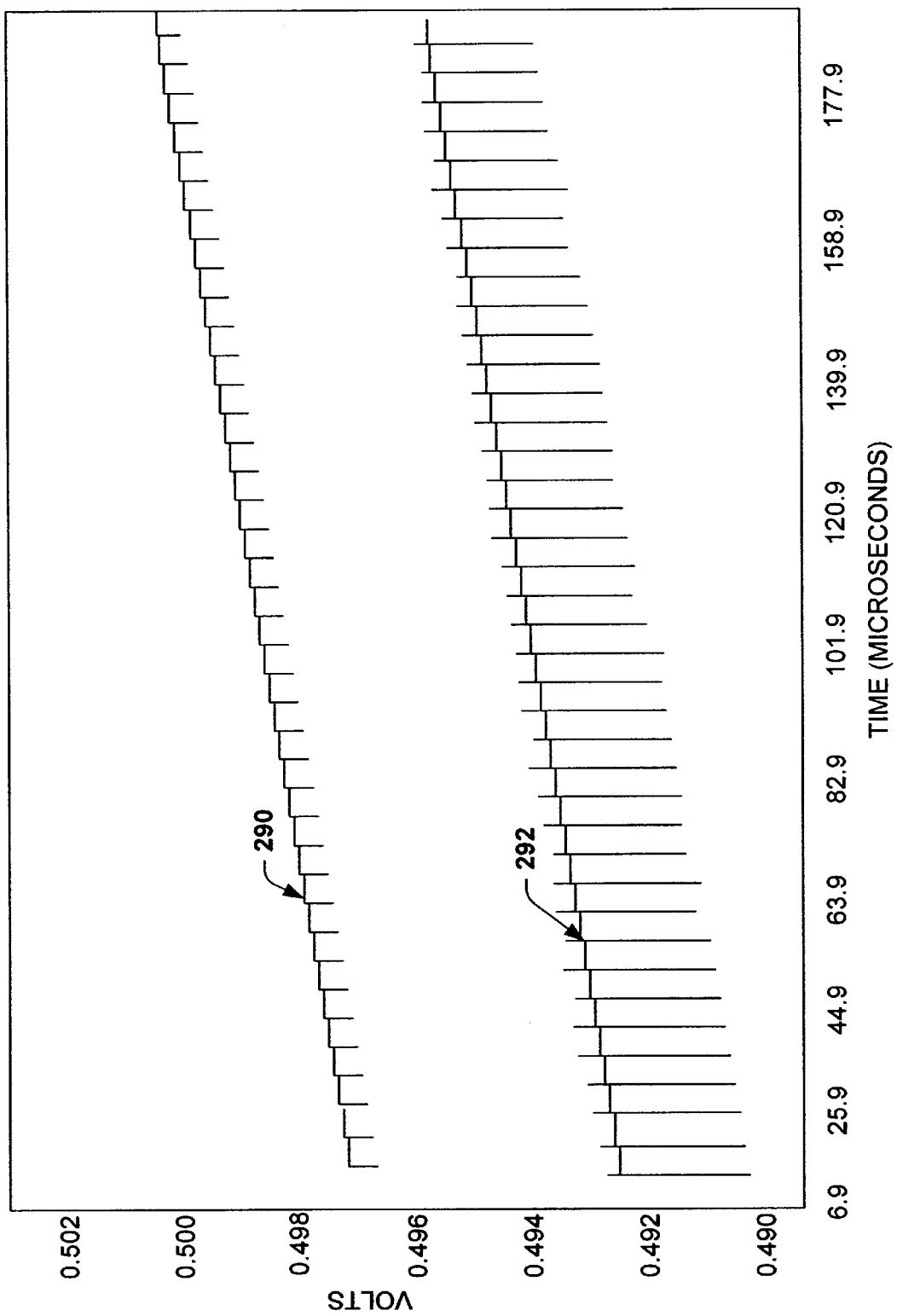
FIG. 7 is a graph that illustrates glitch energy with respect to time comparing a DAC implemented in accordance with an aspect of the present invention relative to a more typical type of DAC.

FIG. 7 further illustrates a graph depicting part of an exponential output for a DAC in accordance with an aspect of the present invention, such as might correspond to an enlarged view of part of the graph 290 of FIG. 6. Also illustrated in FIG. 7 is a similar plot of an output of a conventional system. A comparison of the respective outputs 280 and 292 clearly illustrates the lower glitch energy associated with the DAC operating in accordance with an aspect of the present invention.

Figure 8:
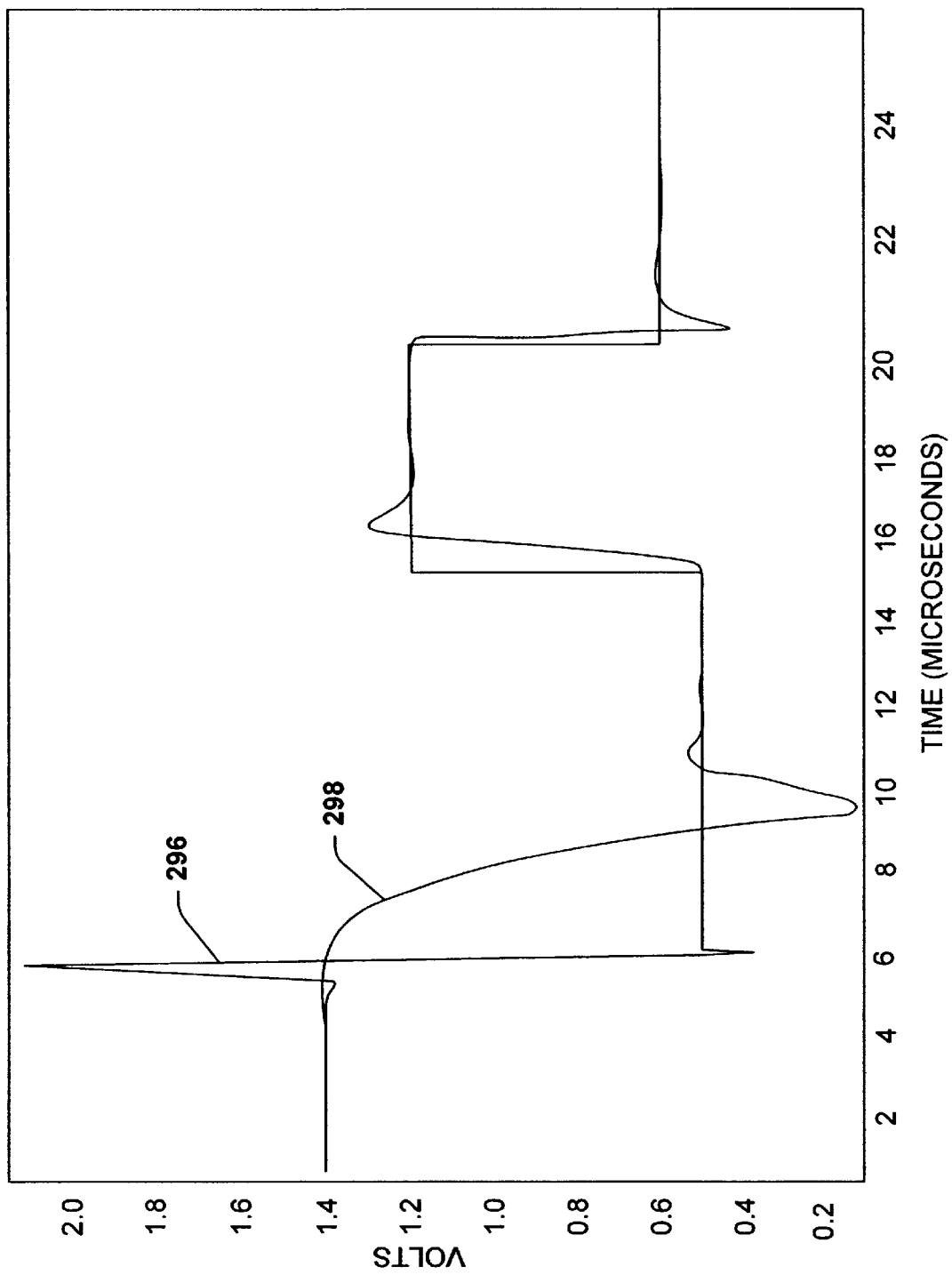
FIG. 8 is a graph that illustrates power up and settling time comparing a DAC implemented in accordance with an aspect of the present invention relative to a more typical type of DAC.

Another advantageous characteristic of the DAC 200 is improved powering up and settling characteristics when compared to other designs. For example, FIG. 8 depicts a plot 296 of the output of a DAC in accordance with an aspect of the present invention and a plot 298 of a more conventional DAC configured to have similar transfer characteristics. While the voltage plot 296 of FIG. 5 exhibits a spike at power up, it settles in considerably less time when compared to the other system.

Referring back to FIG. 5, the DAC 200 also facilitates testing in accordance with an aspect of the present invention. In particular, the DAC 200 includes a switch device (e.g., a MOSFET) 300 coupled to an intermediate node 302 (e.g., between segments 212 and 214) of the ladder stage 204. The switch 300 can be activated during a test mode to supply a desired test voltage to an intermediate node of the DAC 200. For example, the switch 300 can couple the test node 302 to $V_{ref+}$ or another desired voltage having a level substantially higher than associated with such node when the DAC is operating in its normal operating mode. Application of the test voltage facilitates testing linearity of the lower potential segments 214, 216, 218 and 220.

By way of illustration, the cost of testing is reduced because the step size is increased, producing larger voltage steps between adjacent codes. Large voltage changes can be tested in less time because the effects of electrical noise are reduced. Since noisy signals require averaging to remove the effects of noise on measurement repeatability, and since test time is increased by averaging, the increased signal step size leads to less averaging and, therefore, lower testing costs. After testing the DAC with the desired test voltage, additional testing can be performed with the switch 300 deactivated so that the DAC can operate in its normal mode, in which the breakpoint voltages can be measured as well as the linearity associated with the higher potential segments 206, 208, 210 and 212.

Figure 9:
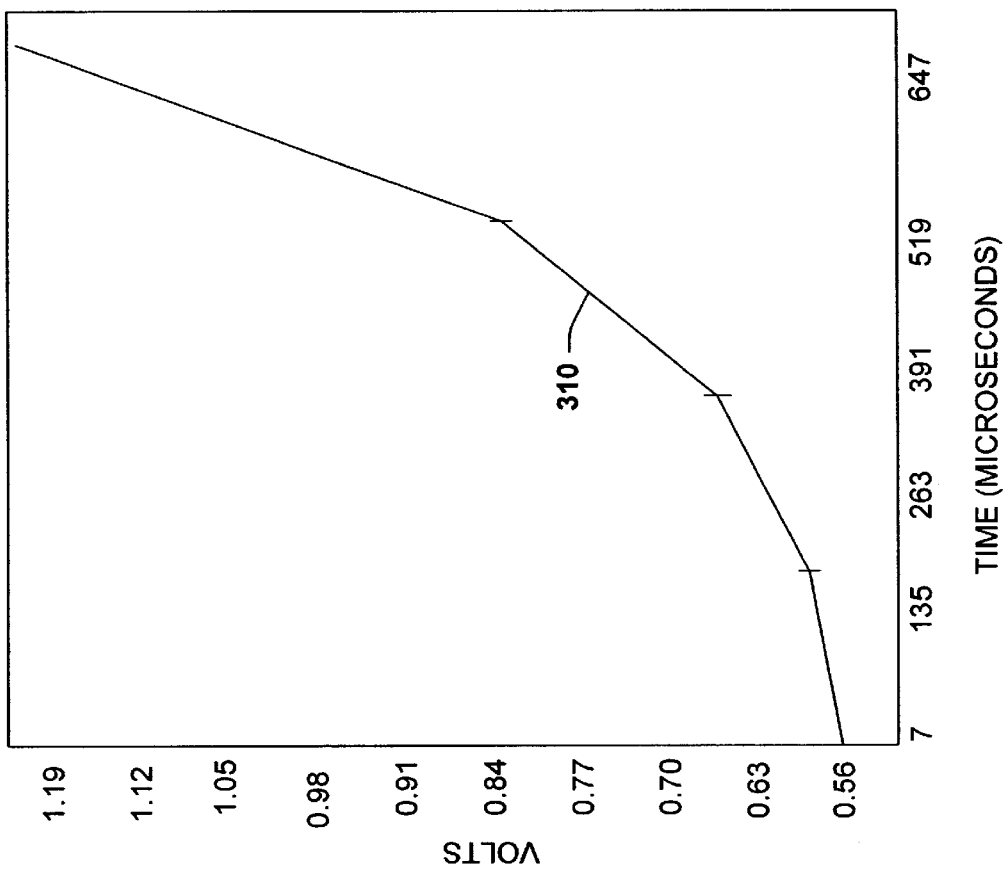
FIG. 9 is an example of output voltage provided by a piecewise linear DAC operating in a test mode in accordance with an aspect of the present invention.

For example, FIG. 9 illustrates a plot 310 of the DAC output 222 (FIG. 5) during application of the test voltage of about 1.2 V applied to the node between segments 212 and 214 (e.g., corresponding to input code 127) via activation of the switch 300. As shown in FIG. 9, each of the segments exhibits desired linearity. Advantageously, the stepping through of codes 0 to 127, which corresponds to nodes between the $V_{ref-}$ and the node 302, during the test mode occurs quickly (e.g., in about 700 microseconds), which greatly improves manufacturing throughput.

Figure 10:
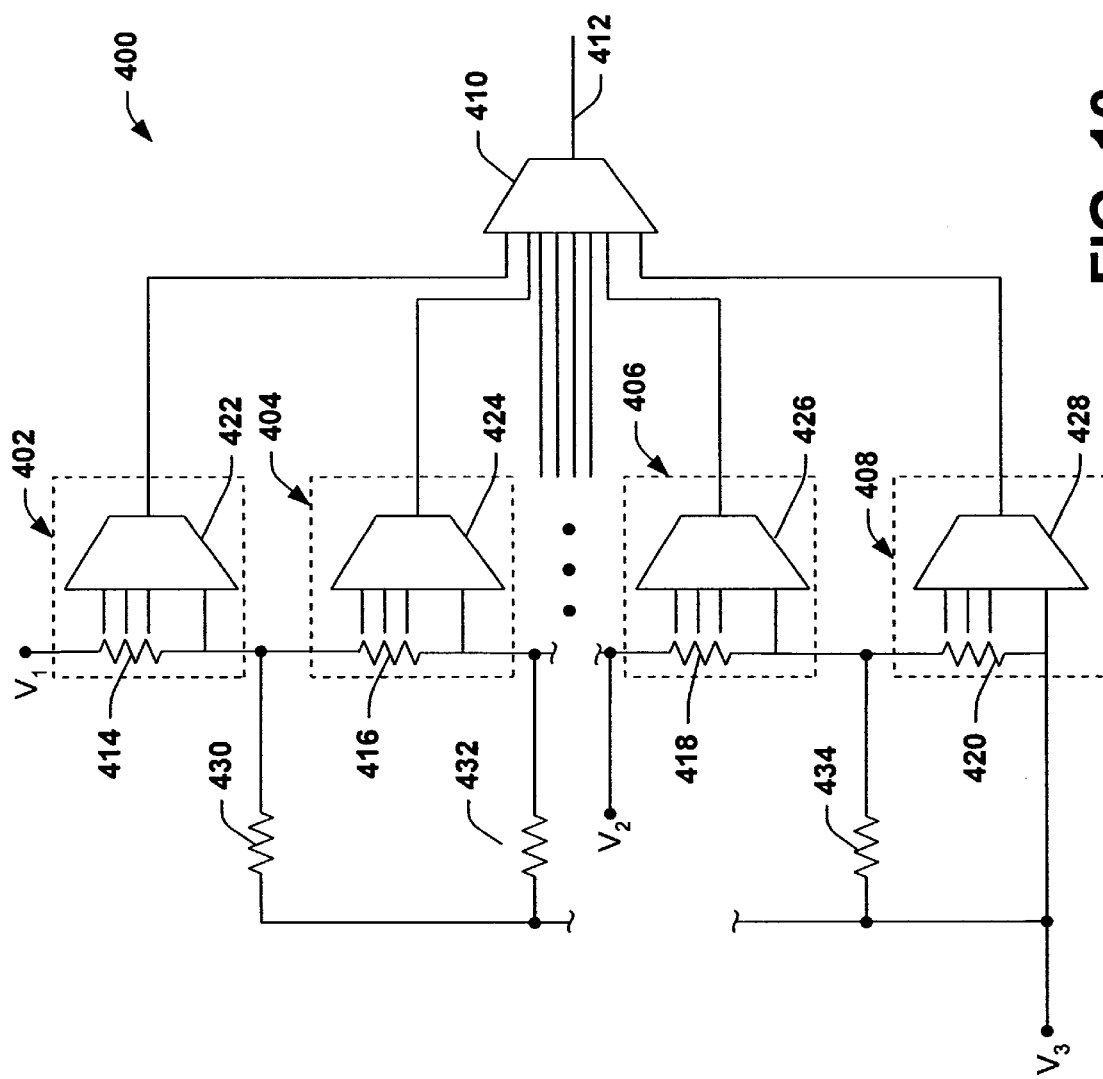
FIG. 10 is an example of a piecewise linear DAC implemented in accordance with an aspect of the present invention.

FIG. 10 illustrates an example of a DAC 400 in accordance with another aspect of the present invention. In this example, the DAC 400 includes a plurality of linear ladder systems 402, 404, 406 and 408 connected in series between reference voltages $V_1$ and $V_3$. Each of the ladder systems has an output that feeds into a switching network (or MUX) 410 that selects which ladder output is to be provided to the DAC output 412. The output 412 further could be amplified, such as by a voltage follower op-amp, to appropriately buffer the output signal.

The ladder systems 402, 404, 406 and 408, for example, can include a plurality of resistors (schematically indicated at 414, 416, 418 and 420) connected in series between end nodes thereof. Nodes intermediate the resistors 414–420 are selectively connectable to the corresponding ladder outputs via switches, such as MUXs 422, 424, 426 and 428. The resistors 414–420 can be selected so that intermediate nodes in each ladder system provide a linear stepwise response between the voltages at the ends nodes.

In accordance with an aspect of the present invention, tap resistors 430, 432 and 434 are connected between some of the breakpoint nodes (e.g. between ladder systems) and $V_3$. Another breakpoint node (or nodes) is coupled to a predetermined voltage potential $V_2$. If $V_2$ has a voltage that is between $V_1$ and $V_3$ monotonicity of the DAC output will be guaranteed. By directly connecting one or more breakpoint nodes to different fixed potentials, the shape of the DAC output response can be tailored to exhibit desired piecewise linear segments having different slope, as described herein. For example, each breakpoint node can, in accordance with an aspect of the present invention, be set to any arbitrary voltage between $V_1$ and $V_3$, such as through the appropriate choice of tap resistors, current sources, voltage sources, and the like so as to approximate virtually any desired transfer characteristic with piecewise linear segments (e.g., exponential, logarithmic, S-shaped, etc.). It is to be appreciated that other arrangements can be implemented with the DAC 400, as described herein, to provide such desired transfer characteristics.

Figure 11:
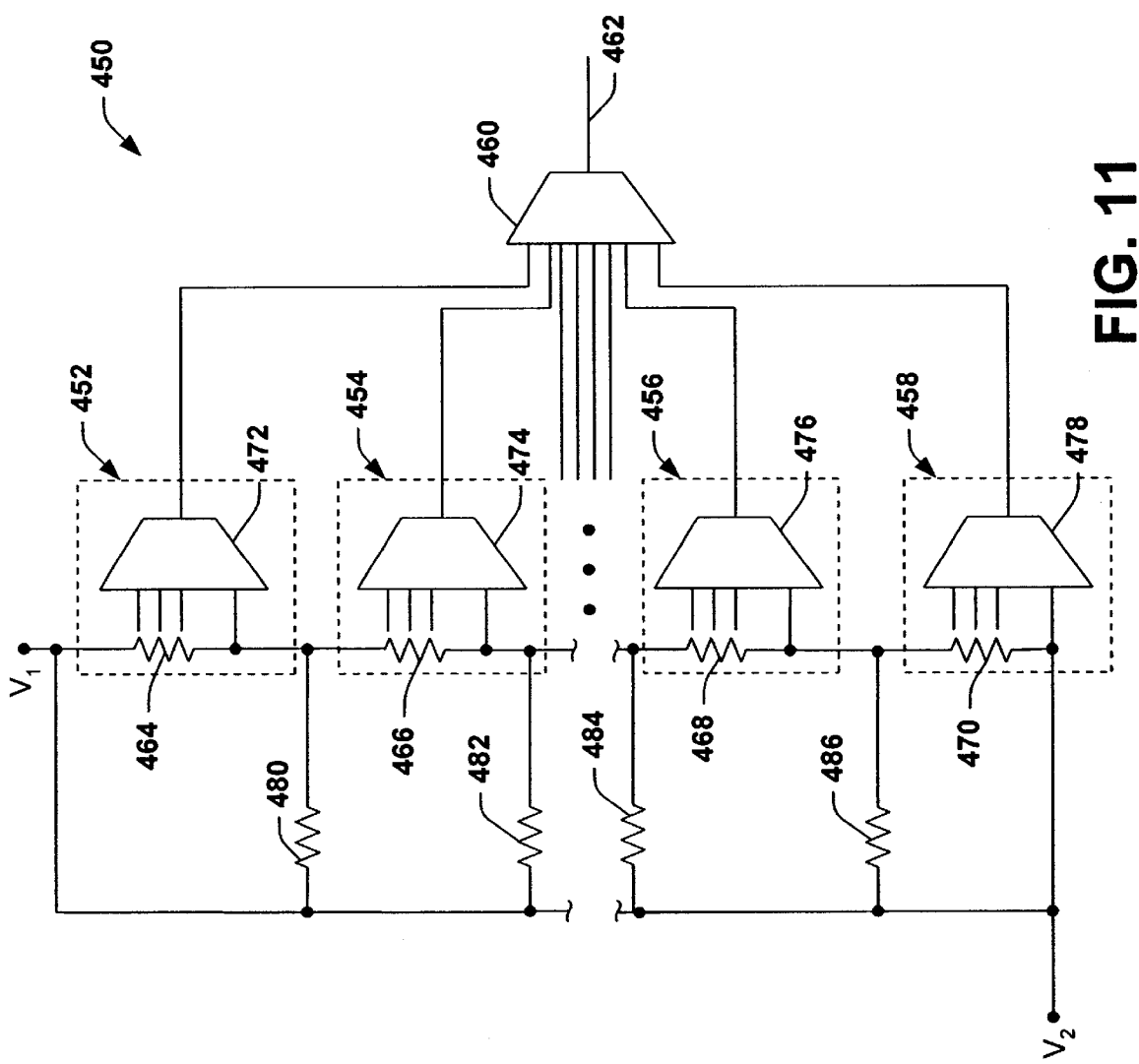
FIG. 11 is an example of a piecewise linear DAC implemented in accordance with an aspect of the present invention.

FIG. 11 illustrates an example of a DAC 450 in accordance with another aspect of the present invention. In this example, the DAC 450 includes a plurality of ladder systems 452, 454, 456 and 458 connected in series between reference voltages $V_1$ and $V_2$. Each of the ladder systems 452–458 has an output that feeds into an associated switching network (or MUX) 460 that selects which ladder output is to be provided to a DAC output 462. The output 462 also could be amplified, such as by a voltage follower op-amp, to appropriately buffer the output signal.

Each ladder system 452, 454, 456, 458, for example, includes a resistor string (schematically represented at 464, 466, 468, 470) connected in series between associated end nodes thereof. Some or all of the end nodes of the ladder systems 452–458 correspond to breakpoint nodes. The resistors 464–470 of each ladder system can be fixed or variable. For example, the resistors 464–470 in each ladder system 452–458 can be matched so that the voltages at intermediate nodes in each ladder system provides a desired linear response (e.g., evenly spaced voltages). The resistors 464–470 are selectively connectable to the corresponding ladder outputs via switches, such as MUXs 472, 474, 476 and 478. The resistors 464–470 can be selected so that the intermediate nodes in each ladder system provide a linear stepwise response between the voltages at the ends nodes.

In accordance with an aspect of the present invention, some of the breakpoint nodes are coupled to $V_1$ via associated tap resistors 480 and 482 and others of the break point nodes are coupled to $V_2$ via associated tap resistors 484 and

486. The illustrated arrangement provides for monotonicity at the DAC output. For example, if $V_1 > V_2$, then the DAC output is monotonically increasing, with the outputs of 458 and 456 having respectively increasing positive slopes and the outputs of 454 and 456 having respectively decreasing negative slopes. It is to be understood and appreciated that any of the breakpoint nodes could be connected to either $V_1$ or $V_2$ via appropriate resistor taps to provide desired DAC transfer characteristics in accordance with an aspect of the present invention.

Figure 12:
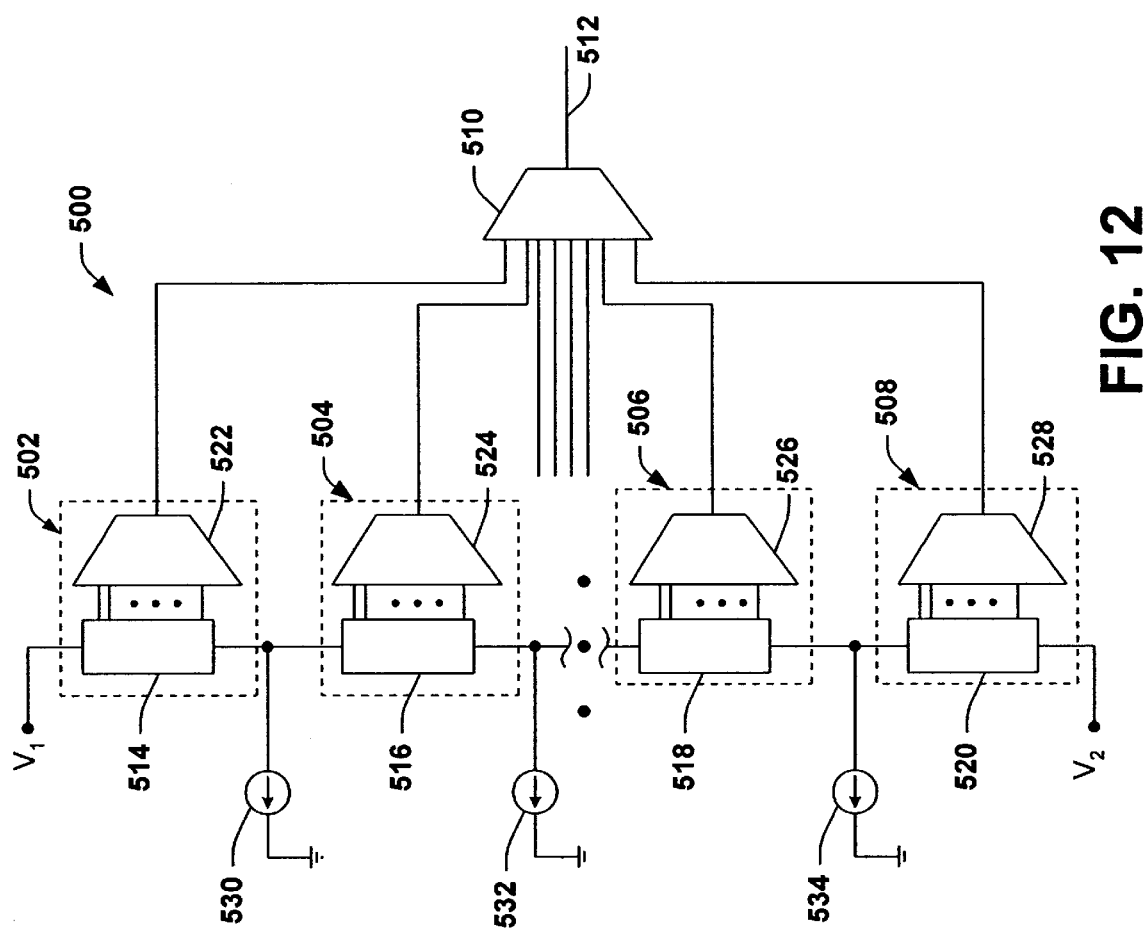
FIG. 12 is an example of a piecewise linear DAC implemented in accordance with an aspect of the present invention.

FIG. 12 illustrates another example of a DAC 500 in accordance with another aspect of the present invention. In this example, the DAC 500 includes a plurality of ladder systems 502, 504, 506 and 508 connected in series between reference voltages $V_1$ and $V_2$. Each of the ladder systems 502–508 has an output that feeds into switching network (e.g., a MUX) 510 that selects which ladder output is to be provided to a DAC output 512. The DAC output 512 could be amplified, such as by a voltage follower op-amp (or other circuitry), to appropriately buffer the output signal.

Each ladder system 502–508, for example, includes a plurality of impedance components (schematically represented at blocks 514, 516, 518 and 520) connected in series between associated end nodes thereof. The impedance components 514–520, which, for example, include resistors, can have fixed or variable impedance values. In one example, the impedance components could be a string of matched resistors so as to produce a plurality of evenly spaced voltages between the breakpoint voltages at the end nodes of the given ladder system. Each of the ladder systems 502–508 includes switches, such as MUXs 522, 524, 526 and 528 that are operative to connect selected nodes of the each ladder system to the ladder output.

The DAC 500 also includes current sources 530, 532 and 534 coupled to the respective breakpoint nodes between ladder systems 502–508 for sinking or sourcing desired current relative to the respective nodes. The current sources 530–534 could be fixed or variable. By sinking or sourcing a desired amount of current relative to each breakpoint node, the nodes can be set to a desired breakpoint voltage in accordance with an aspect of the present invention. Further by employing matched impedance components in each system 502–508 to provide linear segments, the DAC 500 can be programmed and/or configured to approximate any desired transfer characteristics (e.g., exponential, logarithmic, S-shaped, etc.) with piecewise linear segments from each ladder system.

Figure 13:
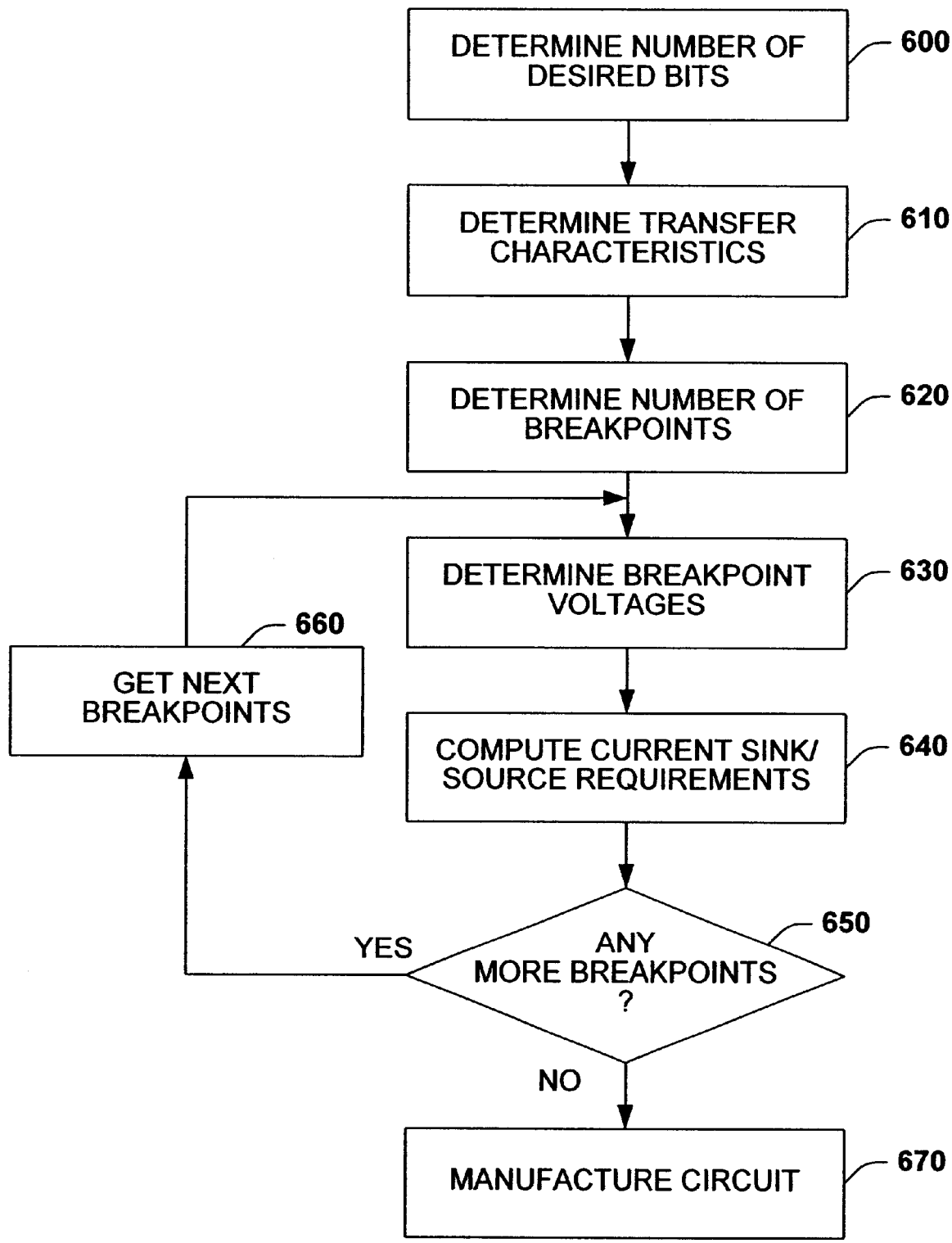
FIG. 13 is a flow diagram illustrating a methodology to facilitate designing a digital to analog converter in accordance with an aspect of the present invention.
Figure 14:
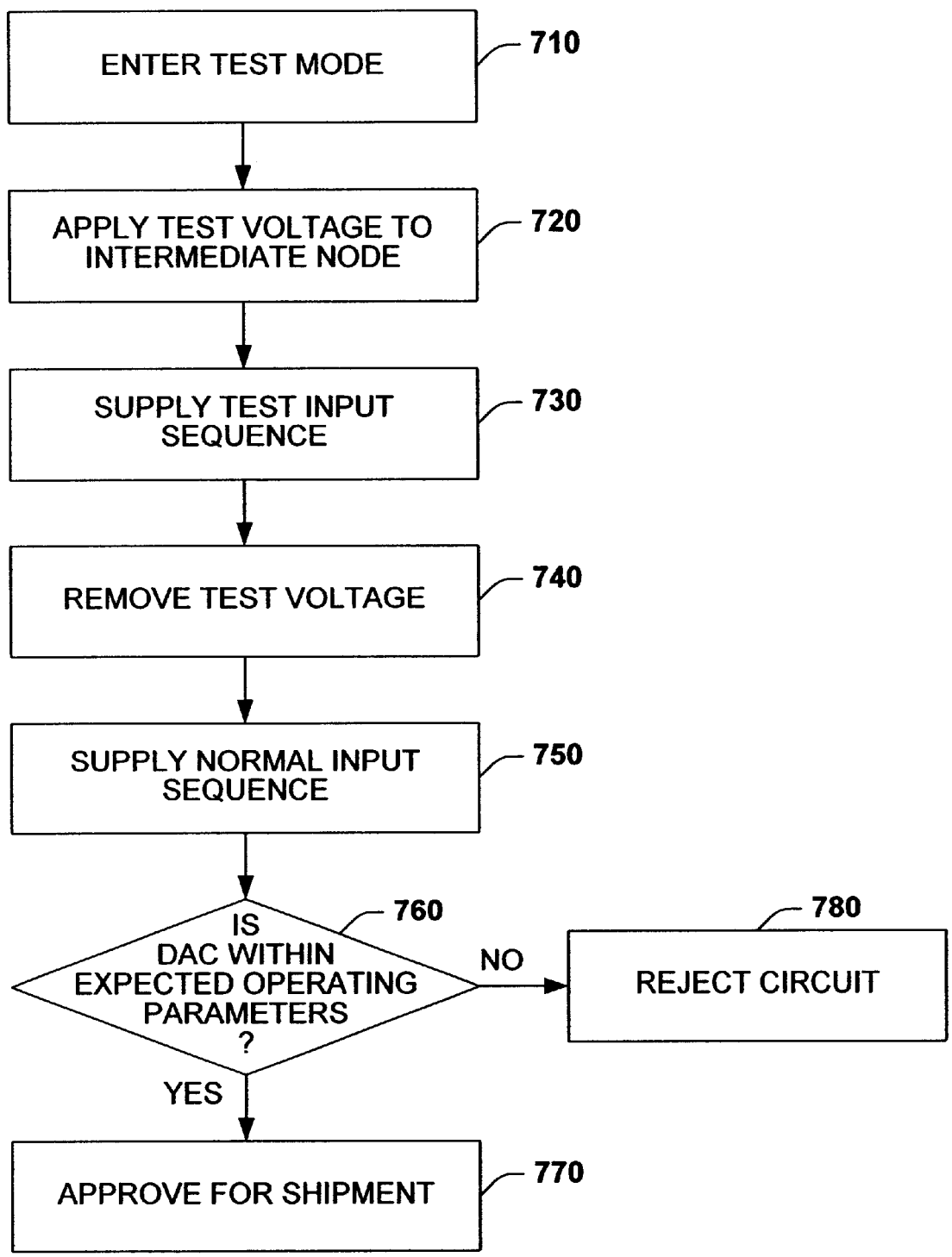
FIG. 14 is a flow diagram illustrating a methodology for testing a digital to analog converter in accordance with an aspect of the present invention.

In view of the foregoing structural and functional features described above, a methodology for designing a DAC and a methodology for testing a DAC in accordance with various aspects of the present invention will be better appreciated with reference to FIGS. 13 and 14, respectively. While, for purposes of simplicity of explanation, the methodologies are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

Referring to FIG. 13, the methodology begins at 600 in which the length of the digital input word that is to be converted to a corresponding analog signal is determined. It is to be appreciated that the DAC being designed can accommodate any length digital input word. The word length, however, determines the number of selectable nodes that of the DAC that can be connected to the DAC output. Each node corresponds to a different code value, so that a digital input word having a given code value causes the DAC to connect node associated with that code value to the DAC output.

Next, at 610, desired transfer characteristics for the DAC output are determined. The DAC can be configured to approximate virtually any desired transfer characteristic (e.g., exponential, logarithmic, S-shaped, etc.) using piecewise linear segments in accordance with an aspect of the present invention. The transfer characteristic further can be monotonic or non-monotonic, as desired.

At 620, a number of breakpoints for the desired transfer characteristics are determined. The number of breakpoints defines the resolution for the piecewise linear approximation. For example, a greater number of breakpoints will provide a smoother non-linear transfer characteristic. The DAC being designed, for example, includes a main resistor ladder (e.g., a resistor string) that produces a plurality (e.g. thirty-two) evenly spaced voltages between each of the breakpoint voltage pairs. The evenly spaced voltages provide linear segments that are combined to form desired piecewise linear, non-linear DAC transfer characteristics in accordance with an aspect of the present invention.

At 630, breakpoint voltages are determined for each breakpoint based on the desired transfer characteristics determined at 610. The breakpoint voltages can define points at which a different slope is to occur according to the transfer characteristics. In order to implement the desired breakpoint voltages, an amount of current may need to be sunk or sourced relative to each breakpoint node.

At 640, an amount of current to sink/source relative to the given breakpoint node to provide the desired breakpoint voltage is determined. By way of example, when tap resistors are to be utilized in the DAC to source and/or sink current, the value of the tap resistors can be computed as a function of a pair of adjacent breakpoint voltages and the level of current to source/sink relative to the breakpoint node to provide the desired breakpoint voltage. The resistor values can be rounded to the nearest unit resistor value N*R to achieve adequate accuracy in most cases. For enhanced accuracy the resistance values may be set by unit resistors in series and/or parallel combinations to achieve a resolution of fractions of a unit resistance.

Next, at 650, a determination is made as to whether there are any more breakpoint nodes at which current needs to be provided to achieve a desired breakpoint voltage. If such additional breakpoints exist, the methodology proceeds to 660 to get the next breakpoint. The breakpoint voltage of this node is used in conjunction with a preceding breakpoint voltage to compute an appropriate amount of current to source/sink relative to the breakpoint node for the circuit arrangement being used. The calculation of current and breakpoint voltages can be used to compute a value for a corresponding tap resistor. If the determination at 650 is negative, indicating that all current sinks/sources e.g., tap resistors) have been computed, the methodology proceeds to 670 in which the corresponding circuit can be manufactured.

Associated with the manufacture of an integrated circuit implementing a DAC, in accordance with an aspect of the present invention, is a testing methodology to ensure the efficacy of the integrated circuit. FIG. 14 depicts such a test methodology in accordance with an aspect of the present invention. The test methodology begins at 710 with entering a test mode, which can include connecting a device that includes the DAC to appropriate test equipment and initiating the test. At 720, a test voltage is applied to an intermediate node of the DAC, such as in response to applying an activation test signal to an input (e.g., a pin) of the device under test. The test signal, for example, activates a switch (e.g., a transistor) integrated into the DAC that couples the intermediate node to the desired test voltage. The test voltage can be about equal to a high reference voltage used in normal DAC operation.

With the test voltage being applied, a test sequence of input digital words can be provided to the DAC (730) to step the DAC sequentially through codes up to that associated with the intermediate node. For the example of an eight-bit DAC, the intermediate node can correspond to code 127, although other nodes/codes could be used as the intermediate node for testing purposes. The resulting DAC output is stored, which can be employed to test the linearity of the segments of the DAC output. After stepping through the desired codes, the test voltage can be removed at 740, such as by terminating the activation test signal. Then, at 750 the DAC can be operated in its normal operating mode and sequentially stepped through additional codes, which can include the remaining code values. The measured DAC output during the normal mode also can be stored.

At 760, a determination is made as to whether the DAC being tested has performed within expected operating parameters. For example, the DAC output from the test mode can be evaluated to ascertain whether it exhibited proper linearity between breakpoints. The portion of the test results from the normal operating mode can be evaluated to confirm the accuracy of the breakpoint voltages as well as the linearity between breakpoints. If the DAC has performed within expected parameters, the device can be approved for shipment at 770. However, if the test results yield unexpected or undesirable performance characteristics, the methodology proceeds from 760 to 780 in which the DAC is rejected and is not shipped. If a large number of devices fail to meet desired performance, then the DAC can be redesigned to help ensure desired performance.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A digital to analog converter, comprising:
    a series network of impedance components comprising at least one resistor, the series network being divided into segments of n resistors, where n is a positive integer;
    a plurality of nodes associated with digital input words connecting adjacent impedance components;
    a tap coupled to an associated node of the plurality of nodes and operative to one of source and sink electrical current relative to the associated node;
    a switching system operative to couple a selected one of the nodes to an output according to a digital input word, and
    a plurality of taps each coupled to an associated breakpoint node that interconnects an adjacent pair of resistor segments so as to one of source and sink electrical current relative to the breakpoint node to which the tap is coupled.

2. The converter of claim 1, the resistors further comprising at least one matched resistor operative to provide evenly spaced voltages at the nodes of each resistor segment between breakpoint nodes.

3. The converter of claim 2, the resistors comprising unit resistors.

4. The converter of claim 1, the switching system further comprising a redundant switch coupled to each of the taps, each redundant switch being operative to mitigate glitch energy by activating one of the redundant switches when switching between an associated adjacent pair of the segments.

5. The converter of claim 1, the tap providing a predetermined breakpoint voltage at the associated node at a level intermediate voltage levels at end nodes of the plurality of nodes so as to ensure monotonicity at the output.

6. The converter of claim 1, the tap further comprising at least one resistor connected between the associated node and a reference voltage so as to source or sink a desired amount of current relative to the associated node.

7. The converter of claim 6 the series network being connected between first and second reference voltages, the tap further comprising at least one resistor connected between the associated node and one of the first and second reference voltages.

8. The converter of claim 7 further comprising a plurality of resistive taps, the series network being connected between first and second reference voltages and divided into segments of n resistors, where n is a positive integer, each of the resistive taps coupling an associated node that interconnects an adjacent pair of resistor segments to one of the first and second reference voltages.

9. The converter of claim 8 each of the resistive taps coupled to the associated node and to one of the first and second reference voltages having a lower voltage, the resistive taps also having resistances selected to provide the converter with a monotonic exponential transfer characteristic.

10. The converter of claim 1, further comprising a switch operative to couple an intermediate node of the series network to a test voltage so as to facilitate testing of the converter.

11. A digital to analog converter, comprising:
    a resistor string comprising a plurality of resistors connected in series between first and second reference voltages, the resistor string including nodes between adjacent of the plurality of resistors associated with digital input words;
    at least one resistive tap coupled to at least one associated node of the resistor string and to a third reference voltage so as to provide a desired breakpoint voltage at the at least one associated node; and
    at least one multiplexer operative to couple a selected node of the resistor string to an output based on a value of a digital input word.

12. The converter of claim 11 further comprising a plurality of resistive taps, each of the taps being coupled to an associated node of the resistor string and to an associated reference voltage so as to provide a desired breakpoint voltage at the at least one associated node.

13. The converter of claim 12, the at least one multiplexer further comprising a redundant switch coupled to a node between an adjacent plurality of the resistors, the redundant switch being operative to mitigate glitch energy by activating the redundant switches when switching between the adjacent plurality of the resistors.

14. The converter of claim 12, the resistor string being divided into resistor segments having a plurality of resistors, each of the resistive taps being coupled to an associated breakpoint node that interconnects an adjacent pair of the resistor segments so as to provide a desired breakpoint voltage at the breakpoint node to which each resistive tap is coupled.

15. The converter of claim 14, the breakpoint voltages at the breakpoint nodes being intermediate the first and second reference voltages.

16. The converter of claim 14 the resistors of each resistor segment further comprising matched resistors so as to provide evenly spaced voltages at the nodes in each respective resistor segment.

17. The converter of claim 16, the breakpoint voltages being set to approximate desired non-linear transfer characteristics with piecewise linear characteristics provided by each of the resistor segments.

18. The converter of claim 11 further comprising a switch operative to couple an intermediate node of the series network to a test voltage so as to facilitate testing of the converter.

19. The converter of claim 11 the third reference voltage being substantially equal to one of the first and second reference voltages.

20. The converter of claim 11, the third reference voltage being intermediate the first and second reference voltages.

21. A method for making a digital to analog converter (DAC), comprising:
   determining desired non-linear transfer characteristics of the DAC;
   determining a number of breakpoints for approximating the desired transfer characteristics; and
   determining breakpoint voltages for each of the breakpoints.

22. The method of claim 21, further comprising computing values of tap resistors to couple between each node associated with the breakpoints and corresponding reference potential so as to provide the determined breakpoint voltages for each of the respective one of the breakpoints.

23. A method for testing operating characteristics of a digital to analog converter (DAC) comprising a plurality of resistors connected in series between first and second reference voltages with nodes between adjacent resistors, at least one tap being coupled to an associated node to source or sink current relative to the associated node, a switch being coupled to a test node for, when activated, supplying a higher than normal test voltage at the test node, the method comprising:
   activating the switch;
   supplying the test voltage to the test node;
   applying digital input words for the DAC up to a word associated with the test node; and
   measuring an output voltage of the DAC in response to the application of digital words.

24. The method of claim 23, further comprising:
   deactivating the switch to remove the test voltage;
   applying at least one additional digital input words for values greater than that associated with the test node; and
   measuring the output voltage of the DAC in response to the application of digital input words for values greater than that associated with the test node.

25. A digital to analog converter (DAC), comprising:
   a series network of impedance components, a plurality of nodes associated with digital input words connecting adjacent impedance components;
   One or more breakpoint circuits each of which is associated with a breakpoint node of the plurality of nodes, the total number of breakpoint nodes fewer than the total number of nodes in the plurality of nodes, each breakpoint node operative to one of source and sink electrical current relative to the associated node such that the desired non-linear transfer characteristics of the DAC can be approximated by selection of breakpoint voltages; and
   a switching system operative to couple a selected one of the nodes to an output according to a digital input word.

26. The converter of claim 25, the breakpoint voltages at the breakpoint nodes being intermediate the first and second reference voltages.

27. The converter of claim 26, the resistors of each resistor segment further comprising matched resistors so as to provide evenly spaced voltages at the nodes in each respective resistor segment.

28. The converter of claim 27 the breakpoint voltages being set to approximate desired non-linear transfer characteristics with piecewise linear characteristics provided by each of the resistor segments.

29. The converter of claim 25, the at least one multiplexer further comprising a redundant switch coupled to a node between an adjacent plurality of the resistors, the redundant switch being operative to mitigate glitch energy by activating the redundant switches when switching between the adjacent plurality of the resistors.

30. The converter of claim 25, further comprising a switch operative to couple an intermediate node of the series network to a test voltage so as to facilitate testing of the converter.

* * * * *